United States Patent
Roullet

(10) Patent No.: US 6,370,366 B2
(45) Date of Patent: *Apr. 9, 2002

(54) TELEPHONY DEVICE COMPRISING A BASE STATION AND AT LEAST A SUBSCRIBER UNIT, SUBSCRIBER UNIT FOR SUCH A TELEPHONY DEVICE AND METHOD USED IN SUCH A TELEPHONY DEVICE

(75) Inventor: Pierre Roullet, Lissieu (FR)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,531

(22) Filed: Dec. 8, 1998

(30) Foreign Application Priority Data

Dec. 15, 1997 (FR) .............................. 97 15880

(51) Int. Cl.[7] ................................. H04Q 7/20
(52) U.S. Cl. ................. 455/194.1; 455/174.1; 714/704; 714/706
(58) Field of Search .......................... 455/192.3, 194.1, 455/202, 212, 570, 218, 229, 158.3, 174.1, 175.1, 12.1; 370/260, 464, 252, 242, 310, 316, 509–514; 704/228, 201; 371/37.1–37.9, 31; 342/420, 421; 714/799, 746, 704, 706, 708

(56) References Cited

U.S. PATENT DOCUMENTS

| | | | | |
|---|---|---|---|---|
| 4,422,171 A | * | 12/1983 | Wortley et al. | 714/706 |
| 4,590,468 A | * | 5/1986 | Stieglitz | 340/825.52 |
| 5,309,443 A | * | 5/1994 | Schorman | 375/351 |
| 5,621,772 A | * | 4/1997 | Maturi et al. | 375/366 |
| 5,687,184 A | | 11/1997 | Lorenz et al. | 371/43 |
| 5,778,030 A | * | 7/1998 | Bruckert et al. | 375/317 |
| 5,982,830 A | * | 11/1999 | Maturi et al. | 375/366 |
| 5,995,827 A | * | 11/1999 | Gitlin | 455/416 |
| 6,009,389 A | * | 12/1999 | Dovic et al. | 704/228 |
| 6,055,497 A | * | 4/2000 | Hallkvist et al. | 704/228 |
| 6,058,107 A | * | 5/2000 | Love et al. | 370/332 |
| 6,097,772 A | * | 8/2000 | Johnson et al. | 375/346 |

FOREIGN PATENT DOCUMENTS

WO    WO9526094    9/1995    .......... H04M/11/00

* cited by examiner

Primary Examiner—Dwayne Bost
Assistant Examiner—Jean A Gelin
(74) Attorney, Agent, or Firm—Dicran Halajian

(57) ABSTRACT

A communication device communicates with a station and includes a receiver which receives speech signal frames from the station. The speech signal frames have speech signals. The communication device further includes a counter and an attenuation circuit. The counter counts the number of bad frames of the received speech signal frames. The attenuation circuit diminishes the amplitude of the speech signals when the count of the counter is higher than one indicating more than one bad frame is received. The station is either connected to a switched network or is a satellite station.

9 Claims, 2 Drawing Sheets

TELEPHONY DEVICE COMPRISING A BASE STATION AND AT LEAST A SUBSCRIBER UNIT, SUBSCRIBER UNIT FOR SUCH A TELEPHONY DEVICE AND METHOD USED IN SUCH A TELEPHONY DEVICE

Transmission system comprising at least a satellite station and a connection station, a station including a speech message correction device and a method of improving the quality of speech messages.

FIELD OF THE INVENTION

The present invention relates to a transmission system comprising at least a satellite station and a connection station for connecting the system to a switched network, in which system at least one of said stations includes means for receiving speech messages transmitted in frames and a speech message correction device for modifying the speech signal frames as a function of the quality of the transmission.

The invention likewise relates to a station suitable for such a system, which station includes a speech message correction device for modifying the speech signal frames as a function of the quality of the transmission.

The invention also relates to a method of improving the quality of speech messages.

The invention finds interesting applications in the domain of portable radio telephones complying with the GSM and other standards (DCS . . . etc.).

BACKGROUND OF THE INVENTION

Such a system is known from U.S. Pat. No. 5,687,184 in which at least one of the stations includes a message correction device which already notably improves the quality of the messages heard.

SUMMARY OF THE INVENTION

The present invention proposes a system of the type defined in the opening paragraph, which certainly still more improves the quality of the messages received in poor transmission conditions.

For this purpose, such a system is characterized in that the speech message correction device includes a counter of bad frames, an attenuation circuit for diminishing the amplitude of the speech signals for a count of said counter that is higher than a predetermined value.

BRIEF DESCRIPTION OF THE DRAWINGS

These and other aspects of the invention will be apparent from and elucidated with reference to the embodiments described hereinafter.

In the drawings.

DESCRIPTION OF PREFERRED EMBODIMENTS

Figure 1:
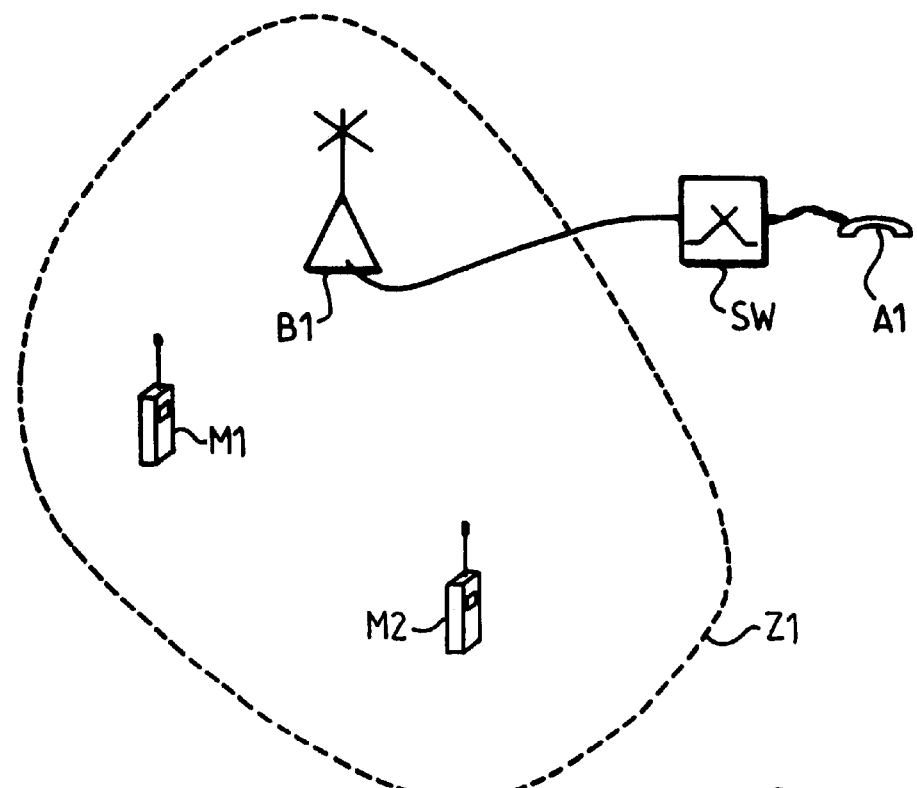
FIG. 1 shows a system in accordance with the invention.

FIG. 1 shows in a diagram a system in accordance with the invention. This system, complying with the GSM standards and shown in this FIG. 1, is formed by a base or connection station B1 and by a plurality of satellite stations which are mobiles or not M1, M2, . . . . Only the stations M1 and M2 are shown in the Figure. The connection station B1 permits of the exchange of data between the satellite stations which are located in its coverage area Z1, on the one hand, and also of the exchange of data with subscribers (for example, subscriber A1) who belong to the normal switched network via a switching center SW, on the other hand.

Figure 2:
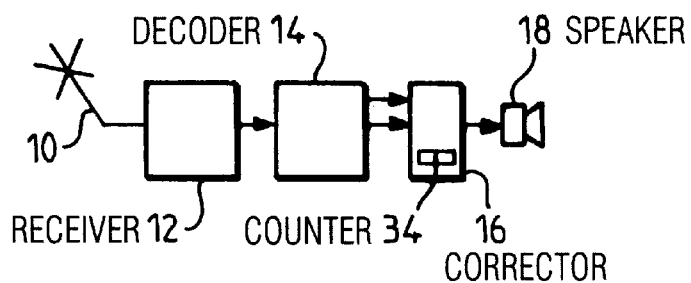
FIG. 2 shows a satellite station in accordance with the invention.

FIG. 2 shows in a diagram a satellite station in accordance with the invention. Only the receiving part is shown, any detail concerning the structure of such a station may be found in cited U.S. Pat. No. 5,687,184. The speech data are transported by waves captured by an antenna 10 connected to a receiving circuit 12 followed by a channel decoder 14 which supplies data to a speech message correction device 16. The output signals of the device are applied to a sound signal restoring circuit 18 formed, inter alia, by an amplified listening loudspeaker.

Figure 3:
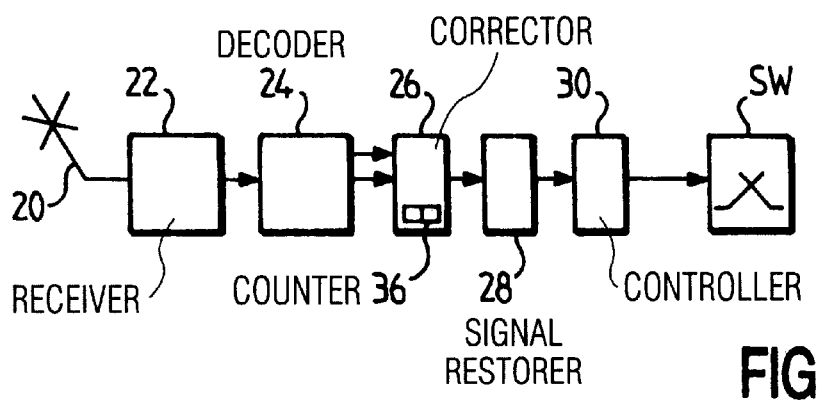
FIG. 3 shows a connection station in accordance with the invention.

FIG. 3 shows in a diagram a connection station in accordance with the invention. Only the receiving part is shown, any detail concerning the structure of such a station may be found in cited U.S. Pat. No. 5,687,184. This station includes the elements 20, 22, 24, 26 and 28 comparable to the respective elements 10, 12, 14, 16 and 18 of the satellite station of FIG. 1. The element 28, however, produces only analog signals on its output and does not produce sound waves as the circuit 18 does. A controller 30 establishes a path to the switch of the switched network SW if need be.

The channel decoders 14 and 24 produce signals by means of which it is possible to determine the bad frames and, if it is necessary, to carry out a process so that the signals returned to the subscribers and to the users are not too annoying when the transmissions are poor, notably sound fragments which give an impression of "chopped words" which are highly annoying to hear.

According to the invention, the devices 16 and 26 include a counter 34 and 36 respectively, for counting the number of bad frames and means for attenuating the sound signals when this number exceeds a certain value, for example, 4.

Figure 4:
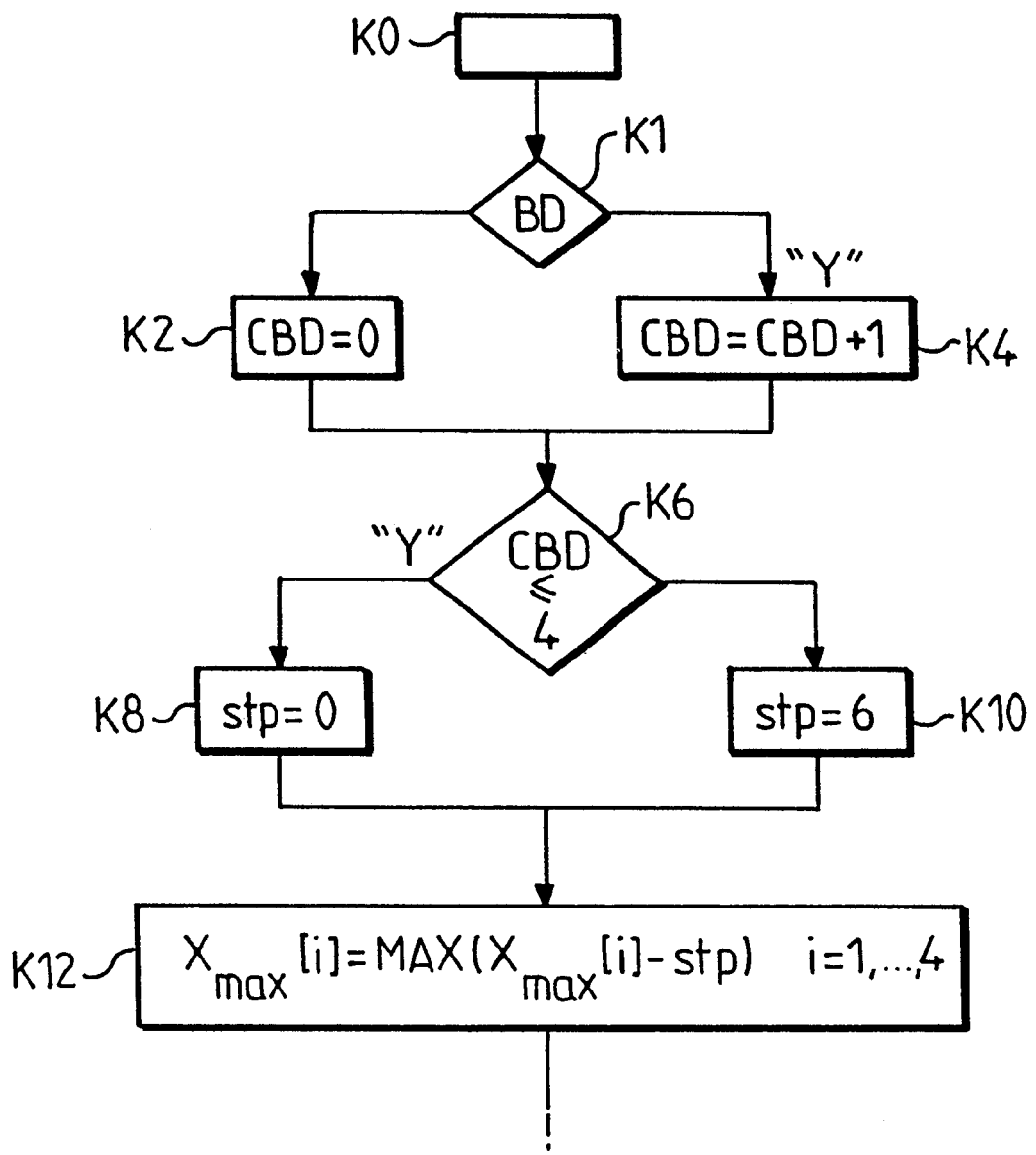
FIG. 4 shows a flow chart representing the steps of the method implemented in accordance with the invention.

FIG. 4 explains the implementation of the invention by means of a flow chart. In this flow chart, box K0 shows the reception of a frame. Box K1 is a test carried out with the signals produced by the channel decoder 14, 24 in view of determining whether the received frame is a good or a bad frame; if it is a good frame, box K2 is proceeded to where the contents CBD of the counter of bad frames 34, 36 is set to zero. If the frame is bad, the contents of this counter are incremented by unity, box K4. Then, in box K6, the contents 10 CBD are tested. If they exceed a certain count, in this example 4, then an incrementation step STP is set to 6 (box K10), if not, the value is set to 0 (box K8). Thus the value of the amplitude of the signals to be applied to the speech restoration circuit assumes the value indicated in box K12:

$$X_{max}[i]=MAX(X_{max}[i]-stp), \text{ for } i=1, \ldots 4,$$

i is the number of the sub-sequences, $X_{max}[i]$ is the amplitude of the sub-sequences. All these values are explained or defined in the standard ETS 300-961.

Thus, by means of the measures proposed by the invention there is avoided that silence samples are inserted too abruptly when the transmission becomes too bad.

What is claimed is:

1. A transmission system comprising at least a satellite station and a connection station for connecting the system to a switched network, wherein in said transmission system at least one of said at least satellite station and said connection station includes means for receiving speech signals transmitted in speech signal frames and a speech message correction device for modifying the speech signal frames as a function of quality of transmission, wherein the speech message correction device includes a counter of bad frames of said speech signal frames, and an attenuation circuit for diminishing the amplitude of the speech signals when a count of said counter is higher than one which indicates that more than one of said bad frames is received, wherein said counter is set to zero when a good frame is received and is incremented when one of said bad frames is received.

2. A satellite station suitable for a system as claimed in claim 1, including a message correction device, characterized in that the speech message correction device has a counter for counting bad frames, an attenuation circuit for diminishing the amplitude of the speech signals for a count of said counter that is higher than a predetermined value.

3. A portable communication device for communicating with a station comprising:

a receiver which receives speech signal frames from said station, said speech signal frames including speech signals;

a counter of bad frames of said speech signal frames; and an attenuation circuit which diminishes amplitude of said speech signals when a count of said counter is higher than one which indicates that more than one of said bad frames is received, wherein said counter is set to zero when a good frame is received and is incremented when one of said bad frames is received.

4. The communication device of claim 3, wherein said station is connected to a switched network.

5. The communication device of claim 3, wherein said station is a satellite station.

6. The portable communication device of claim 3, further comprising a speaker connected to said attenuation circuit, said speaker receiving said speech signals.

7. A method of improving quality of speech signals received in speech signal frames from a communication station comprising:

counting a number of bad frames of said speech signal frames to form a count by setting said count to zero when a good frame is received and incrementing said count when one of said bad frames is received; and attenuating amplitude of said speech signals when said count is higher than one which indicates that more than one of said bad frames is received.

8. A transmission system comprising at least a satellite station and a connection station for connecting the system to a switched network, wherein in said transmission system said at least satellite station and said connection station include a receiver which receives speech signals transmitted in speech signal frames and a speech message correction device which modifies the speech signal frames as a function of quality of transmission, wherein the speech message correction device includes a counter of bad frames of said speech signal frames, and an attenuation circuit for diminishing the amplitude of the speech signals when a count of said counter is higher than one which indicates that more than one of said bad frames is received, wherein said counter is set to zero when a good frame is received and is incremented when one of said bad frames is received.

9. The transmission system of claim 8, wherein said at least satellite station further comprises a speaker connected to said attenuation circuit, said speaker receiving said speech signals.

* * * * *